United States Patent
Cheng

(10) Patent No.: US 10,838,308 B2
(45) Date of Patent: Nov. 17, 2020

(54) METHOD OF DYNAMICALLY ADJUSTING A LIFTING PARAMETER

(71) Applicants: XYZPRINTING, INC., New Taipei (TW); KINPO ELECTRONICS, INC., New Taipei (TW)

(72) Inventor: Po-Wei Cheng, New Taipei (TW)

(73) Assignees: XYZPRINTING, INC., New Taipei (TW); KINPO ELECTRONICS, INC., New Taipei (TW)

(*) Notice: Subject to any disclaimer, the term of this patent is extended or adjusted under 35 U.S.C. 154(b) by 31 days.

(21) Appl. No.: 16/365,638

(22) Filed: Mar. 26, 2019

(65) Prior Publication Data

US 2020/0081351 A1 Mar. 12, 2020

(30) Foreign Application Priority Data

Sep. 11, 2018 (CN) .......................... 2018 1 1056375

(51) Int. Cl.
*G03F 7/20* (2006.01)
*B29C 64/307* (2017.01)
*B29C 64/194* (2017.01)
*B29C 64/232* (2017.01)
*B29C 64/245* (2017.01)
*B29C 64/393* (2017.01)
(Continued)

(52) U.S. Cl.
CPC ........ *G03F 7/70416* (2013.01); *B29C 64/129* (2017.08); *B29C 64/194* (2017.08); *B29C 64/205* (2017.08); *B29C 64/232* (2017.08); *B29C 64/245* (2017.08); *B29C 64/307* (2017.08); *B29C 64/393* (2017.08)

(58) Field of Classification Search
CPC . G03F 7/70416; B29C 64/307; B29C 64/232; B29C 64/245; B29C 64/20; B29C 64/393; B29C 64/386; B29C 64/129; B29C 64/205
USPC ........................................................ 700/119
See application file for complete search history.

(56) References Cited

U.S. PATENT DOCUMENTS

2013/0249146 A1* 9/2013 Zenere ................. B29C 64/135
264/401
2018/0126644 A1* 5/2018 Slaczka ................ B29C 64/245

FOREIGN PATENT DOCUMENTS

EP         2665594 A1    11/2013
WO      2014135464 A2     9/2014

OTHER PUBLICATIONS

Search Report dated Oct. 23, 2019 of the corresponding European patent application.

* cited by examiner

*Primary Examiner* — Mohammad Ali
*Assistant Examiner* — Joshua T Sanders
(74) *Attorney, Agent, or Firm* — Chun-Ming Shih; HDLS IPR Services

(57) ABSTRACT

A method of dynamically adjusting a lifting parameter applied to a stereolithography 3D printer is provided. The method is to retrieve a printing area value of each layer of the sliced physical models and the corresponding lifting parameter after completion of printing this layer of the sliced physical model, and lift a curing platform of the stereolithography 3D printer according to the lifting parameter defining a time period for lifting for peeling this layer of the sliced physical model from a material tank, the time period is not less than a backfilling time for light-curable materials. Therefore, the time for 3D printing can be effectively (Continued)

reduced, and the efficiency of 3D printing can be improved as well.

11 Claims, 10 Drawing Sheets

(51) Int. Cl.
    *B29C 64/129*     (2017.01)
    *B29C 64/205*     (2017.01)

METHOD OF DYNAMICALLY ADJUSTING A LIFTING PARAMETER

BACKGROUND OF THE INVENTION

Field of the Invention

The technical field relates to 3D printing, and more particularly relates to a method of dynamically adjusting a lifting parameter during 3D printing.

Description of Related Art

A stereolithography 3D printer of the related art has an ability to cure the light-curable materials into a 3D physical model by light-irradiating. More specifically, the stereolithography 3D printer comprises a curing platform, a material tank, and a light module. The material tank is used to accommodate the fluid light-curable materials, and a demodeling film is laid on the bottom of the material tank. A surface of above-mentioned demodeling film is very smooth, so as to reduce the stuck extent of the cured light-curable materials (namely slice physical model) being stuck on the tenacity film and prevent the printing from failure.

Because the cured light-curable materials have stickiness and may adhere to the demodeling film, the stereolithography 3D printer must lift the curing platform up to a designated height for peeling the current layer of slice physical model from the bottom of the material tank after each time completion of printing each layer of slice physical model. Moreover, because above-mentioned adhesion is proportional to the area of each layer of slice physical model, for successfully peeling all of possible areas of the slice physical models and providing the sufficient time for the light-curable materials in the material tank backfilling, above-mentioned designated height of the stereolithography 3D printer of the related art is configured to an extremely high value, such that the stereolithography 3D printer of the related art must lift the curing platform to the extremely high height regardless of the area size of the current layer of slice physical model. Furthermore, when the area size is smaller, lifting the curing platform to the smaller designated height can still peeling the slice physical model and providing the sufficient time for backfilling, vice versa. Above-mentioned status that the stereolithography 3D printer of the related art must lift the curing platform to the extremely high designated height significantly increases the time required by 3D printing.

Thus, the stereolithography 3D printing technology of the related art has above-mentioned problems, there is a need for a more effective solution.

SUMMARY OF THE INVENTION

The present disclosed example is directed to a method of dynamically adjusting a lifting parameter having an ability of dynamically adjusting a lifting height according to a printing area value of the current layer of slice physical model.

One of the exemplary embodiments, a method of dynamically adjusting a lifting parameter, the method of dynamically adjusting the lifting parameter is applied to a stereolithography 3D printer, the stereolithography 3D printer comprises a light module, a curing platform, a material tank used to accommodate light-curable materials and a lifting module, a light-transmissive demodeling film being laid on bottom of the material tank. The method of dynamically adjusting the lifting parameter comprises following steps: selecting one layer of print data in order; controlling the lifting module to lift, such that a modeling plane of the curing platform is positioned a default thickness above the demodeling film; controlling the light module to irradiate the light-curable materials between the modeling plane and the demodeling film according to the selected layer of print data for printing one layer of slice physical model on the modeling plane; retrieve a printing area value of the printed layer of slice physical model; retrieving a lifting parameter corresponding to the printing area value; controlling the lifting module to lift the curing platform up according to the lifting parameter for peeling the printed layer of slice physical model and spending a continuous time corresponding to the lifting parameter, wherein the continuous time is not less than a backfilling time for the light-curable materials; and, performing above steps repeatedly until all layers of slice physical models have been printed and are stacked as a 3D physical model.

The present disclosed example can effectively reduce the time for 3D printing, and improve the efficiency of 3D printing.

BRIEF DESCRIPTION OF DRAWING

The features of the present disclosed example believed to be novel are set forth with particularity in the appended claims. The present disclosed example itself, however, may be best understood by reference to the following detailed description of the present disclosed example, which describes an exemplary embodiment of the present disclosed example, taken in conjunction with the accompanying drawings, in which:

DETAILED DESCRIPTION OF THE INVENTION

In cooperation with attached drawings, the technical contents and detailed description of the present disclosed example are described thereinafter according to some exemplary embodiments, being not used to limit its executing scope. Any equivalent variation and modification made according to appended claims is all covered by the claims claimed by the present disclosed example.

Figure 1A:
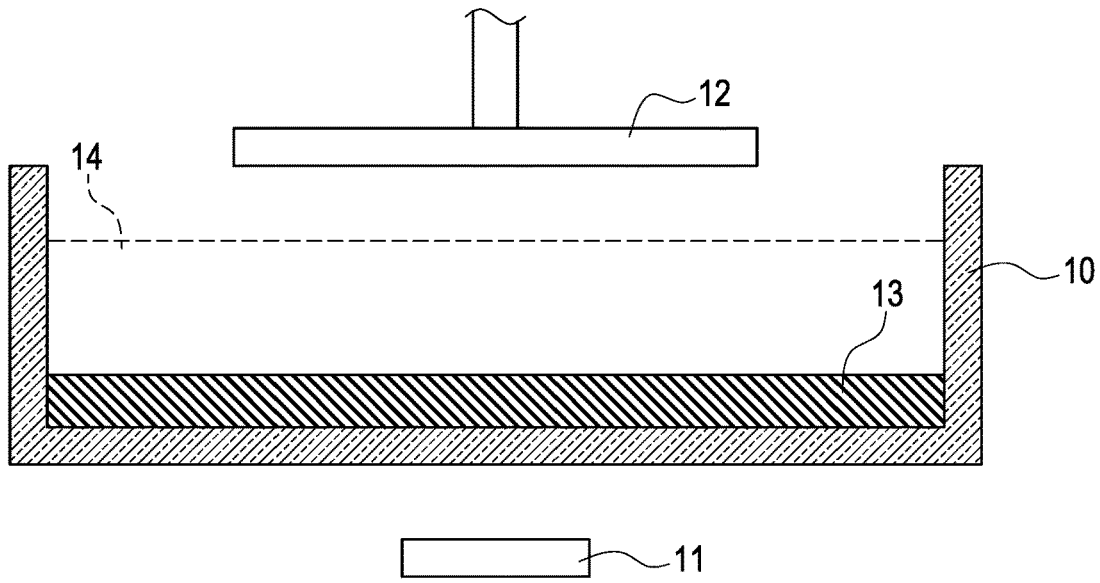
FIG. 1A is a first schematic view of stereolithography 3D printing of the related art.
Figure 1B:
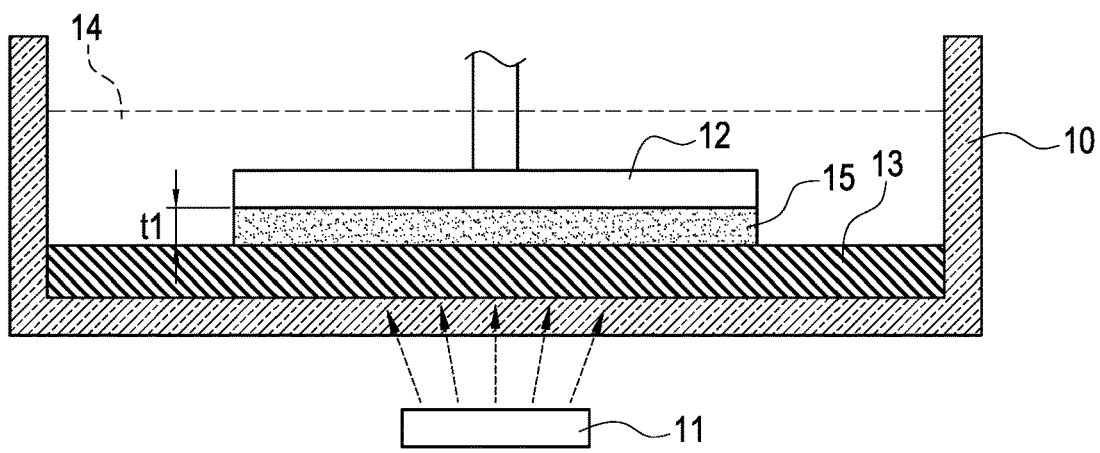
FIG. 1B is a second schematic view of stereolithography 3D printing of the related art.
Figure 1C:
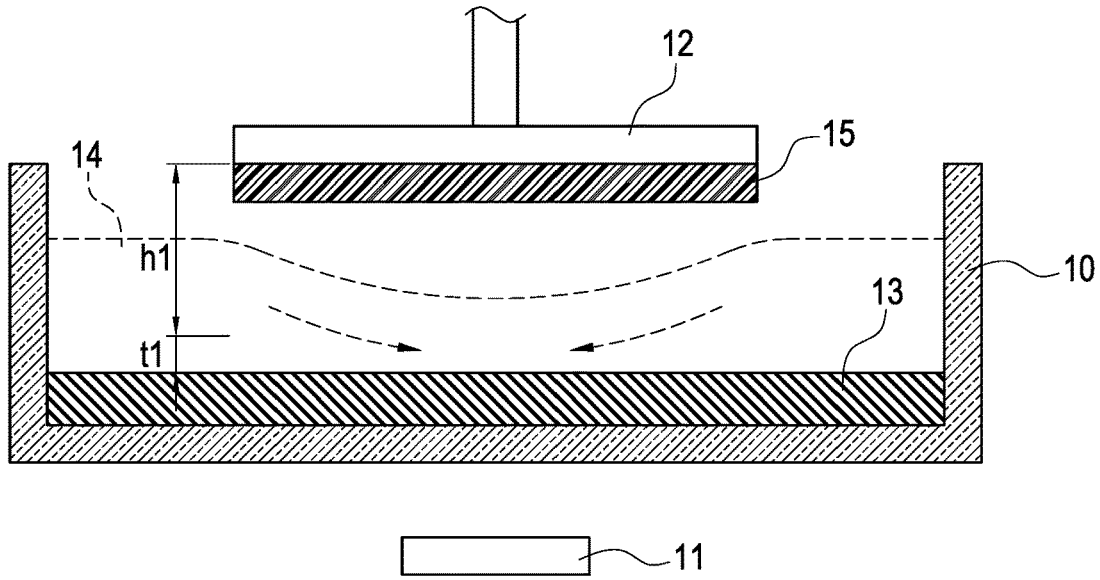
FIG. 1C is a third schematic view of stereolithography 3D printing of the related art.
Figure 1D:
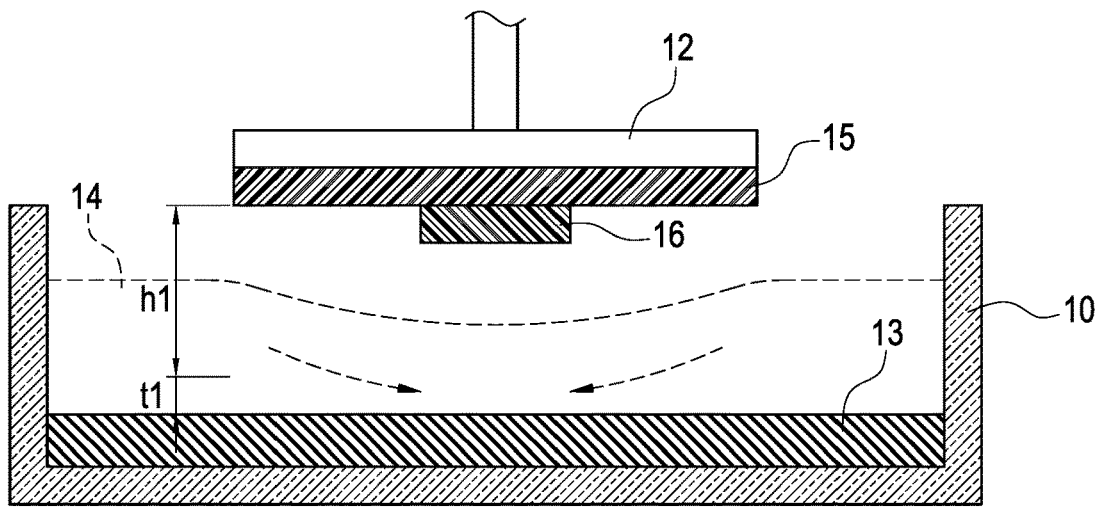
FIG. 1D is a fourth schematic view of stereolithography 3D printing of the related art.

Please refer to FIG. 1A to FIG. 1D simultaneously, FIG. 1A is a first schematic view of stereolithography 3D printing of the related art, FIG. 1B is a second schematic view of stereolithography 3D printing of the related art, FIG. 1C is a third schematic view of stereolithography 3D printing of the related art, and FIG. 1D is a fourth schematic view of stereolithography 3D printing of the related art. FIG. 1A to FIG. 1D are used to exemplary explain the technical problems solved by the present disclosed example.

As shown in FIG. 1A, in general, the stereolithography 3D printer 1 of the related art (take uplight stereolithography 3D printer for example) comprises a material tank 10, a light module 11 and a curing platform 12. The material tank 10 is used to accommodate the fluid light-curable materials 14, and a light-transmissive demodeling film 13 is laid on the bottom of the material tank 10.

As shown in FIG. 1B, the stereolithography 3D printer 1 may control the curing platform 12 to lower for contacting with the light-curable materials 14, and make a worktop of the curing platform 12 be a default thickness t1 away from the demodeling film 13. Then, the stereolithography 3D printer 1 controls the light module 11 to irradiate the light-curable materials 14 between the curing platform 12 and the demodeling film 13 for making the light-curable materials 14 solidify into the first layer of slice physical model 15 (larger area).

Then, as shown in FIG. 1C, the stereolithography 3D printer controls the curing platform 12 to lift up to a default lifting height h1 for making the printed first layer of slice physical model 15 be peeled from the demodeling film 13. Moreover, during lifting the curing platform 12 (such as three seconds), the light-curable materials 14 may backfill a larger space occupied by the first layer of slice physical model 15 before motion via naturally flowing (for example, the backfilling time is three seconds) and making the liquid level revert to be horizontal.

Then, as shown in FIG. 1D, the stereolithography 3D printer 1 still controls the curing platform 12 to lift the default lifting height h1 for peeling the printed second layer of slice physical model 16 from the demodeling film 13 after making the light-curable materials 14 solidify into the second layer of slice physical model 16 (smaller area). Moreover, during lifting the curing platform 12 (the duration may be three seconds), the light-curable materials 14 may backfill a smaller space occupied by the second layer of slice physical model 16 before motion via naturally flowing (for example, the backfilling time is one second) and making the liquid level revert to be horizontal.

In accordance with the above, because the area of the second layer of slice physical model 16 is smaller, the space occupied by the second layer of slice physical model 16 is smaller (less backfilling time is required), and the adhesion between the demodeling film 13 and the second layer of slice physical model 16 is weaker. If the stereolithography 3D printer 1 fixedly lifts the curing platform 12 to the default lifting height h1, the time required by 3D printing will increase.

For example, the backfilling time is one second, the time for lifting the curing platform 12 to the lifting height h1 is three seconds. Namely, two seconds are wasted to wait for lifting the curing platform 12 during printing this layer.

Thus, the stereolithography 3D printing technology will greatly increase the time required by 3D printing because the area size is not under consideration and the lifting height h1 of the curing platform 12 is always fixed. Namely, the lifting parameter for controlling the curing platform does not be changed.

Figure 2:
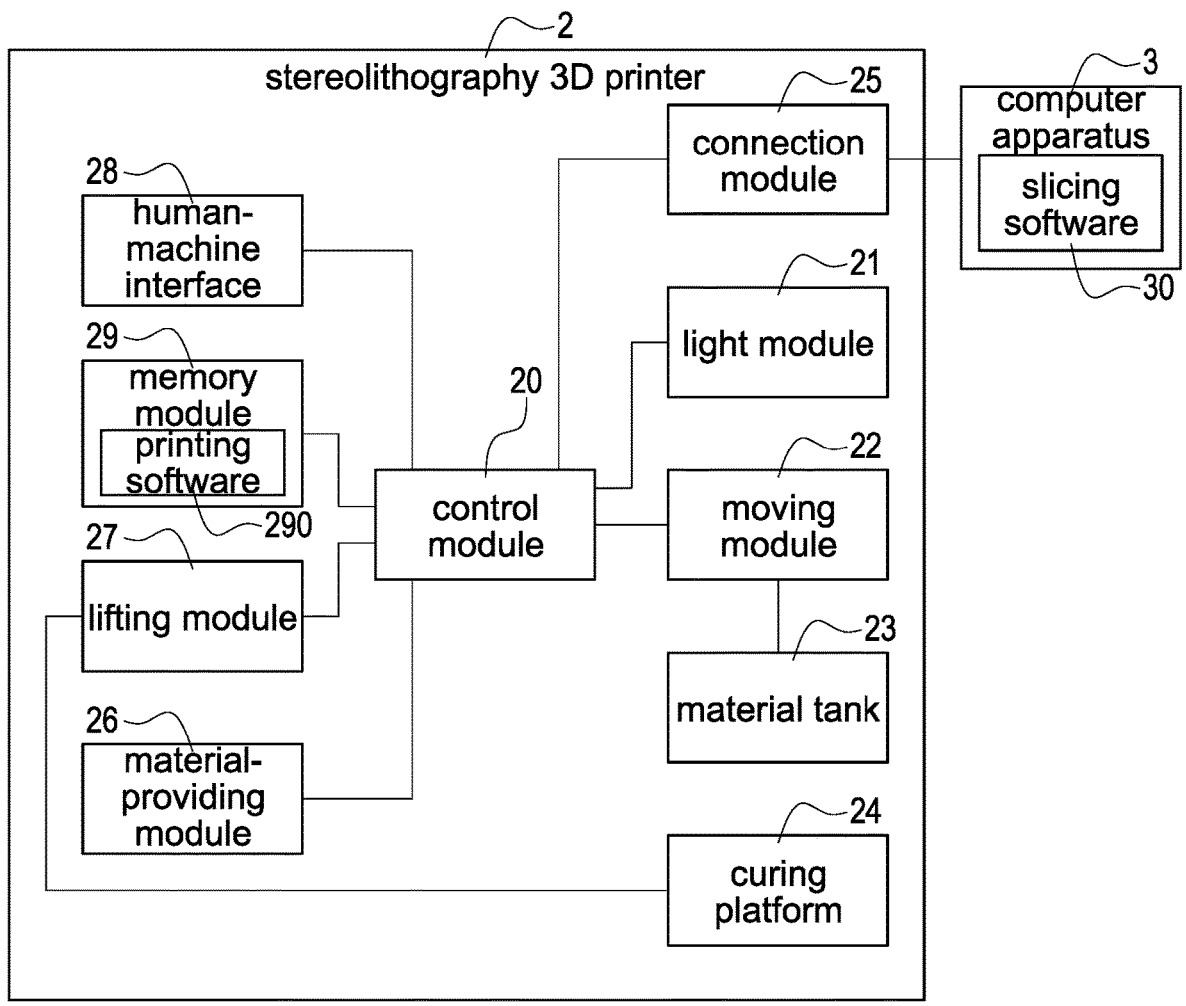
FIG. 2 is an architecture diagram of a stereolithography 3D printer according to one embodiment of the present disclosed example.

Please refer to FIG. 2, which is an architecture diagram of a stereolithography 3D printer according to one embodiment of the present disclosed example. The stereolithography 3D printer 2 mainly comprises a light module 21, a material tank 23, a curing platform 24, a lifting module 27 and a control module 20 electrically connected to above devices.

Figure 4A:
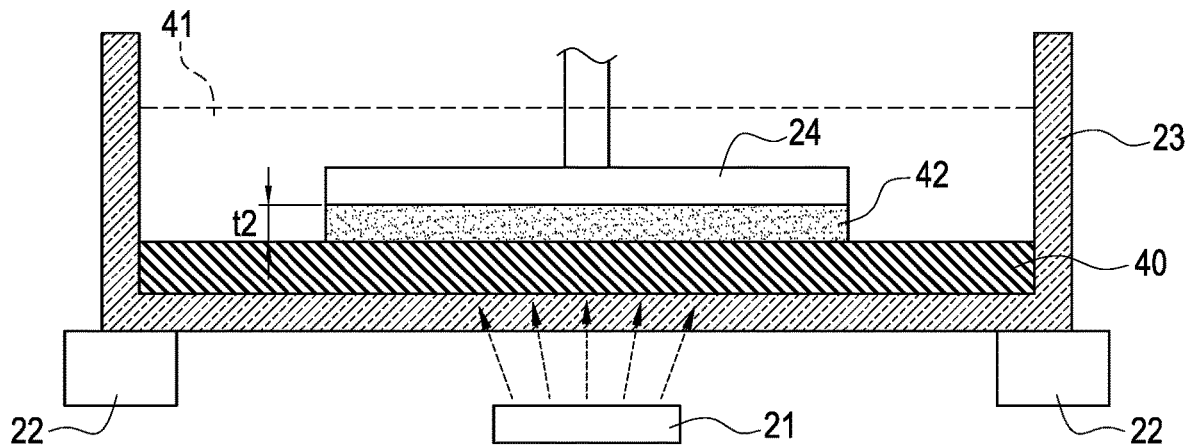
FIG. 4A is a first schematic view of dynamic height mode according to one of embodiments of the present disclosed example.

The control module 20 is configured to control the stereolithography 3D printer 2 to execute the stereolithography 3D printing. The light module 21 is configured to emit the beams to the curing platform 24 (the light module 21 may be a single point light source, a line light source or a plane light source). The beams irradiate one or more designated print position(s) between the material tank 23 and the curing platform 24 for curing the light-curable materials in the light path (the printing positions shown in FIG. 4A are located at the light-curable materials 41 between the curing platform 24 and the demodeling film 40, and the printing positions shown in FIG. 4C are located at the light-curable materials 41 between the first layer of slice physical model 42 and the demodeling film 40).

Figure 3:
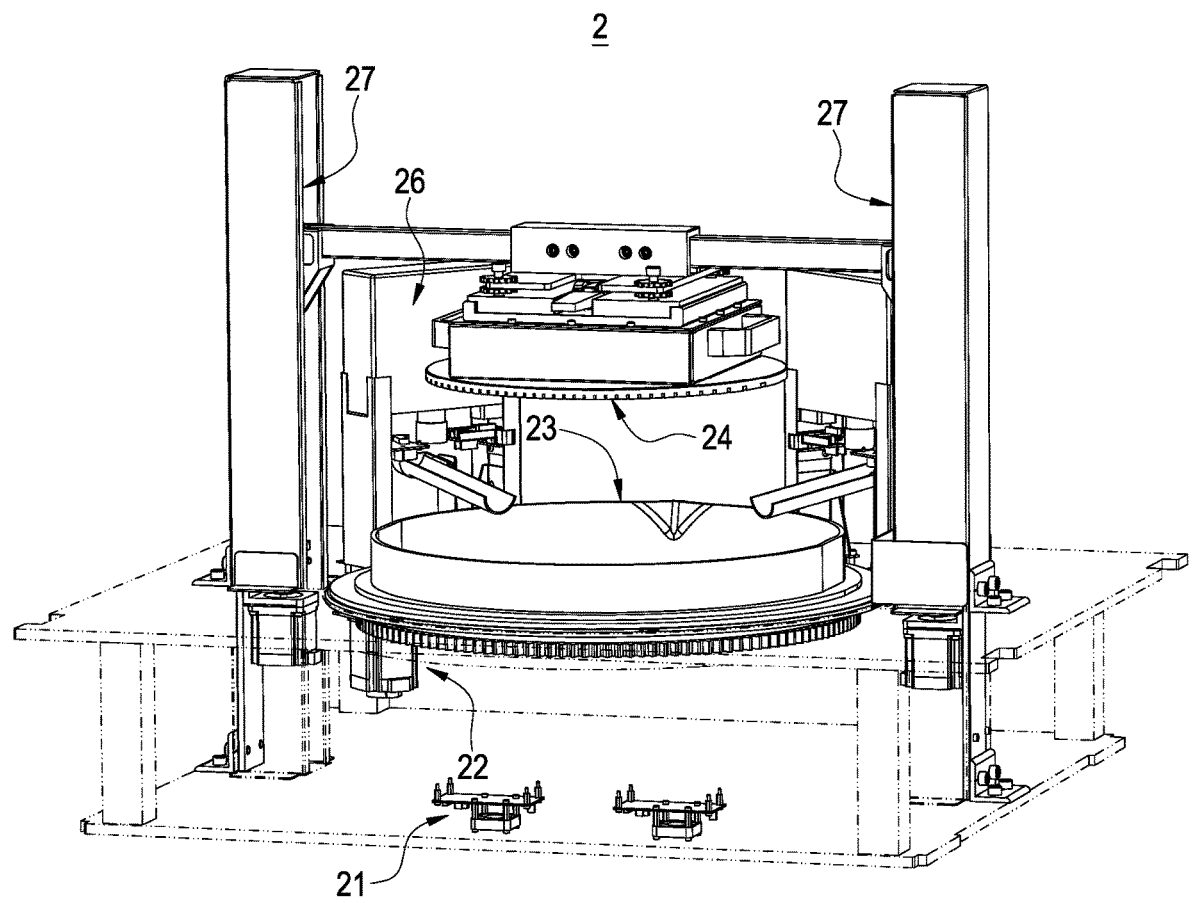
FIG. 3 is a schematic view of appearance of a 3D printer according to one embodiment of the present disclosed example.

The material tank 23 is used to accommodate the fluid light-curable materials 41, such as UV curable resin. One of the exemplary embodiments, when the stereolithography 3D printer 2 is an uplight stereolithography 3D printer (as shown in FIG. 3), a bottom case of the material tank 23 may be made from the light-transmissive material, and one layer of light-transmissive demodeling film (such as the demodeling film 40 shown in FIG. 4A to FIG. 6B, the demodeling film 40 may be made from light-transmissive silicone or synthetic fluoropolymer of polytetrafluoroethylene) is laid on the bottom inside the tank. Thus, the beams irradiated by the light module 21 may transmit through the bottom case of the material tank 23 and the demodeling film 40 to irradiate the light-curable materials 41 in the material tank 23.

The curing platform 24 is used to carry the manufactured 3D physical model. The lifting module 27 is connected to the curing platform 24. The lifting module 27 may be controlled by the control module 20 to move the curing platform 24 along a default axis (such as lifting in the Z-axis).

One of the exemplary embodiments, the stereolithography 3D printer 2 further comprises a moving module 22 electrically connected to the control module 20. The moving module 22 is connected to the material tank 23, and configured to be controlled by the control module 20 to move (such as horizontal movement, rotation or a combination of horizontal movement and rotation) the material tank 23 for making the light-curable materials 41 accommodated in the material tank 23 flow caused by moving the material tank 23.

One of the exemplary embodiments, the material tank 23 may be square, round or the other arbitrary shape. One of the exemplary embodiments, the moving module 22 horizontally moves the material tank 23 back and forth in the horizontal direction (such as any direction in the X-Y plane). For example, moving the material tank 23 back and forth along the X-axis for 15 centimeters, but this specific example is not intended to limit the scope of the present disclosed example.

One of the exemplary embodiments, the moving module 22 horizontally rotates the material tank 23 (such as horizontally rotating along any direction in the X-Y plane). For example, rotating 180 degrees clockwise, rotating 180 degrees anti-clockwise or a combination of rotating clockwise and anti-clockwise.

One of the exemplary embodiments, the stereolithography 3D printer 2 further comprises a connection module 25 (such as USB module, PCI bus module, Wi-Fi module or Bluetooth module). The connection module 25 is configured to connect to the computer apparatus 3 and receive the print data from the computer apparatus 3. One of the exemplary embodiments, the computer apparatus 3 stores a slicing software 30, the computer apparatus 3 may execute the slicing software 30 to execute a slicing process on the 3D model data for obtaining the print data comprising the multiple layers (such as a plurality of 2D images), and transfer the print data to the connection module 25 for 3D printing.

One of the exemplary embodiments, the stereolithography 3D printer 2 further comprises a material-providing module 26 electrically connected to the control module 20. The material-providing module 26 accommodates the fluid light-curable materials 41 and has an ability of pouring the designated volume of light-curable materials 41 (with designated flow rate) into the material tank 23.

One of the exemplary embodiments, the stereolithography 3D printer 2 further comprises a human-machine interface 28 (such as buttons, a monitor, indicators, a buzzer, or any combination of above elements) electrically connected to the control module 20. The human-machine interface 28 is configured to receive a user operation and output the print-related information.

One of the exemplary embodiments, the stereolithography 3D printer 2 further comprises a memory module 29 electrically connected to the control module 20. The memory module 29 is used to store data, such as print data.

One of the exemplary embodiments, the memory module 29 comprises a non-transient computer-readable recording media, above non-transient computer-readable recording media stores a printing software 290 (such as a firmware or an operating system of the stereolithography 3D printer 2), and a plurality of computer-executable codes are recorded in the printing software 290. The control module 20 may control the stereolithography 3D printer 2 to perform each step of the method of dynamically adjusting the lifting parameter of each embodiment of the present disclosed example after execution of the print software 290.

Figure 4B:
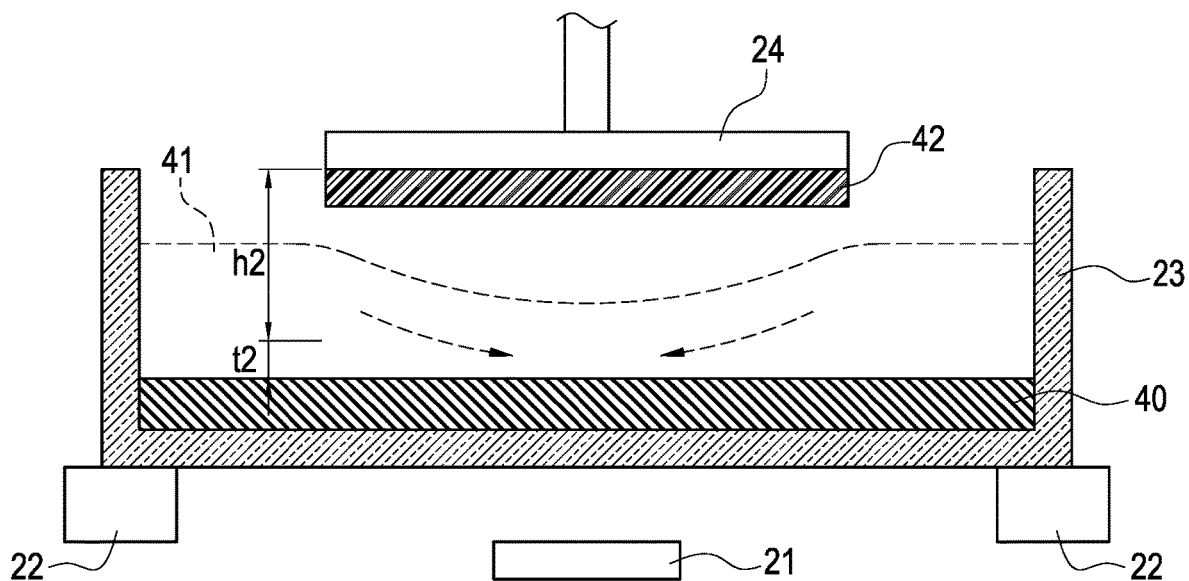
FIG. 4B is a second schematic view of dynamic height mode according to one of embodiments of the present disclosed example.
Figure 4C:
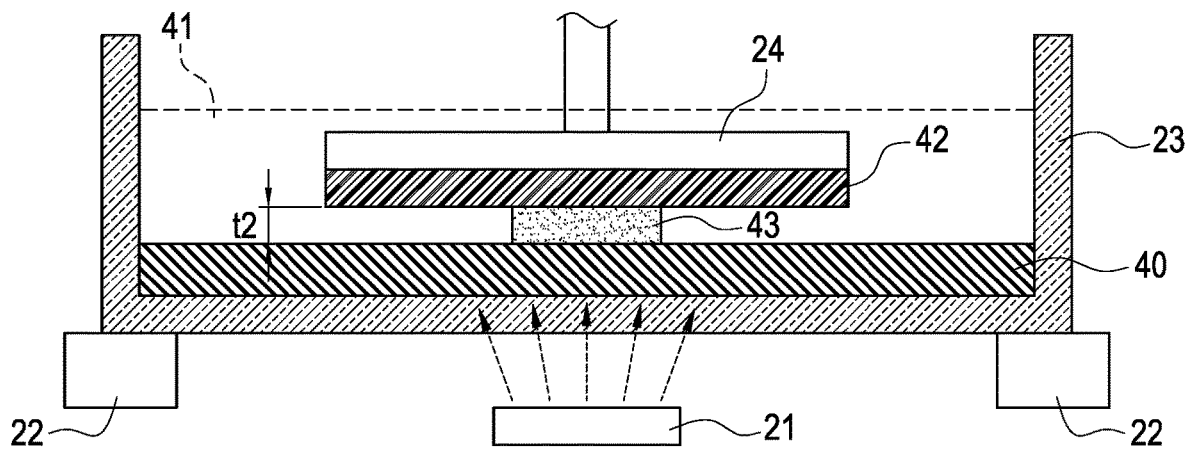
FIG. 4C is a third schematic view of dynamic height mode according to one of embodiments of the present disclosed example.
Figure 4D:
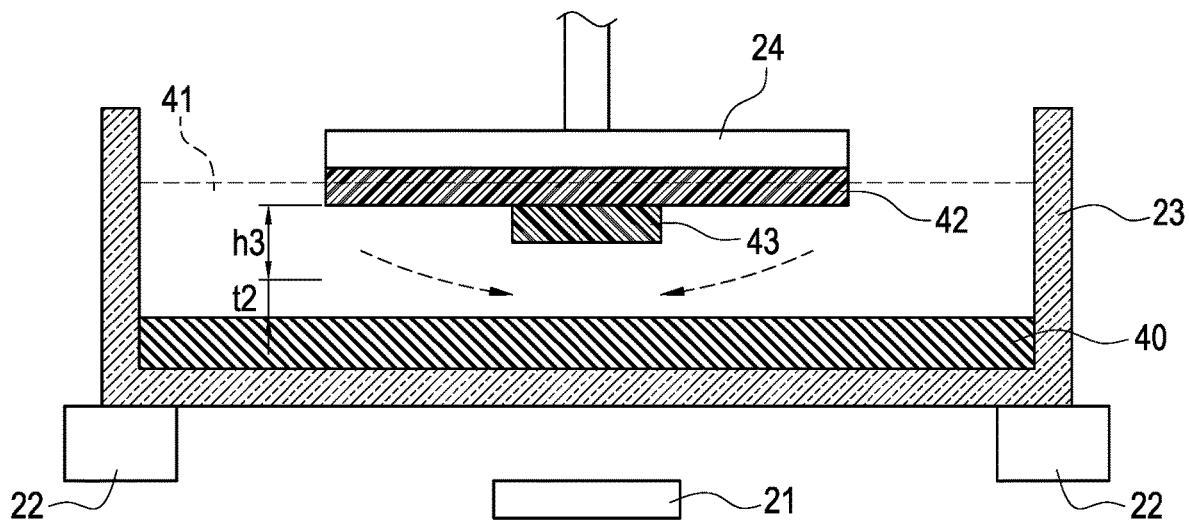
FIG. 4D is a fourth schematic view of dynamic height mode according to one of embodiments of the present disclosed example.
Figure 7:
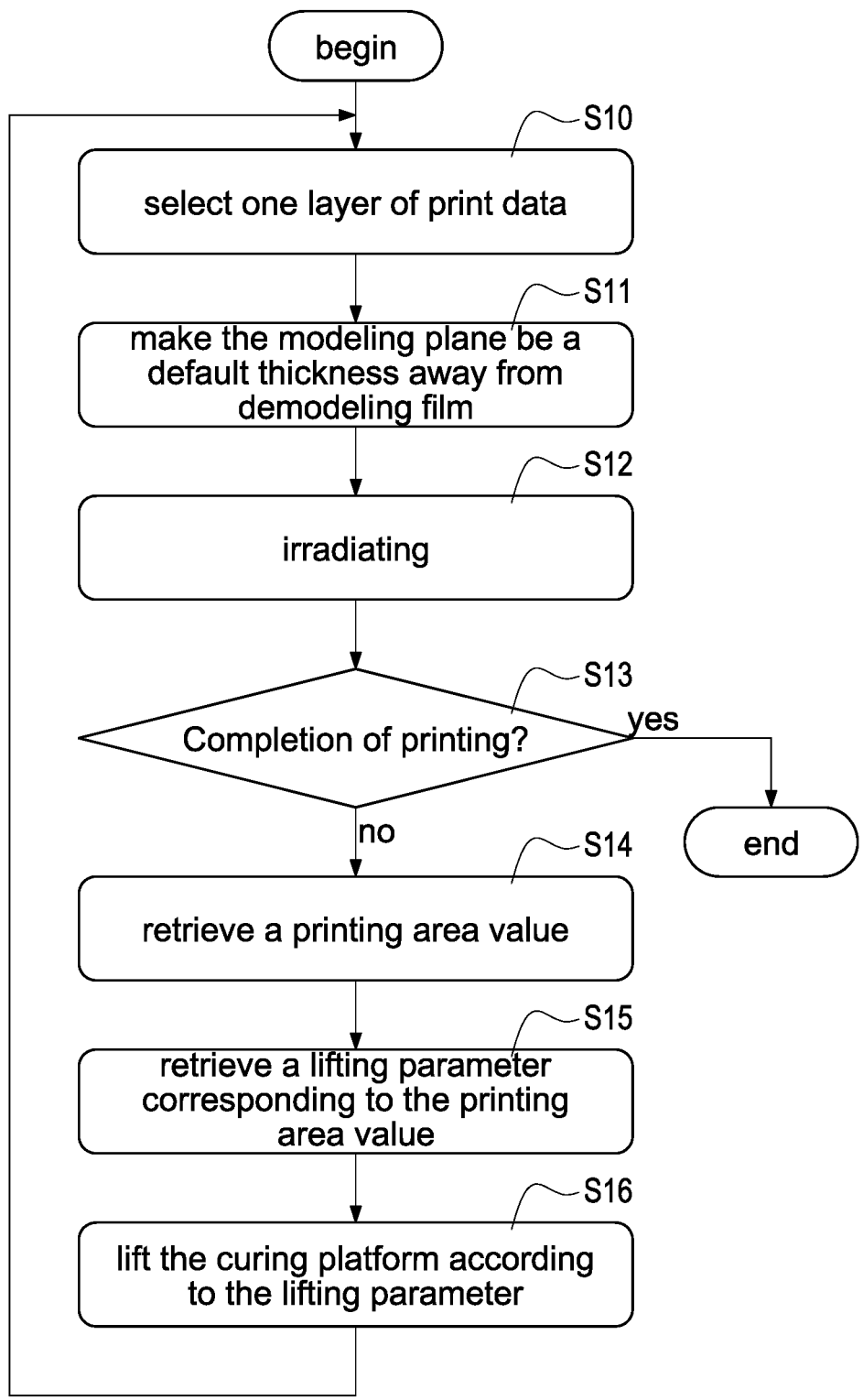
FIG. 7 is a flowchart of a method of dynamically adjusting the lifting parameter according to a first embodiment of the present disclosed example.

Please refer to FIG. 3, FIG. 4A to FIG. 4D and FIG. 7 simultaneously, FIG. 3 is a schematic view of appearance of a 3D printer according to one embodiment of the present disclosed example, FIG. 4A is a first schematic view of dynamic height mode according to one of embodiments of the present disclosed example, FIG. 4B is a second schematic view of dynamic height mode according to one of embodiments of the present disclosed example, FIG. 4C is a third schematic view of dynamic height mode according to one of embodiments of the present disclosed example, FIG. 4D is a fourth schematic view of dynamic height mode according to one of embodiments of the present disclosed example, and FIG. 7 is a flowchart of a method of dynamically adjusting the lifting parameter according to a first embodiment of the present disclosed example.

The method of dynamically adjusting the lifting parameter of each embodiment of the present disclosed example may be implemented by the stereolithography 3D printer 2 shown in figures. The method of dynamically adjusting the lifting parameter of this embodiment comprises following steps.

Step S10: the control module 20 of the stereolithography 3D printer 2 selects one layer of the print data in order, such as the first layer of print data.

One of the exemplary embodiments, the print data may comprise a plurality of 2D images, each of the 2D images corresponds to a layer value and is used to describe a shape of the corresponding layer of slice physical model.

Step S11: the control module 20 moves the curing platform 24 by the lifting module 27 for making a vertical distance between a modeling plane of the curing platform 24 and the bottom of the material tank 23 (such as the center of the demodeling film 40) be a default thickness t2 (as shown in FIG. 4A). One of the exemplary embodiments, the default thickness t2 is not greater than 0.1 millimeters, such as 0.1 millimeters or 0.05 millimeters.

One of the exemplary embodiments, the demodeling film 40 is made from light-transmissive silicon film or polytetrafluoroethylene film.

One of the exemplary embodiments, the modeling plane may be a worktop of the curing platform 24 or a printed top layer of slice physical model. For example, the modeling plane may be the worktop of the curing platform 24 when printing the first layer of slice physical model, and be the top surface of the previous layer of slice physical model when printing the second or higher layer of slice physical model.

Step S12: the control module 20 controls the light module 21 to irradiate the modeling plane according to the selected layer of print data for printing one layer of slice physical model on the modeling plane.

One of the exemplary embodiments, each layer of the print data is a 2D image, the control module 20 may control the light module 21, such that a plurality of positions respectively corresponding to a plurality of pixels of one layer of print data are irradiated according to a plurality of pixel values of the pixels of the selected layer of print data for printing one layer of slice physical model (as the first layer of slice physical model 42 shown in FIG. 4A).

Step S13: the control module 20 determines whether completion of 3D printing. For example, the control module 20 determines whether all of the slice physical models comprising the multiple layers have been printed and stacked as the 3D physical model.

If the control module 20 determines that there is any layer of slice physical model which do not be printed (namely, the 3D printing is incomplete), the control module 20 performs the step S14. Otherwise, the control module 20 finishes the 3D printing.

Step S14: the control module 20 retrieves a printing area value of the currently selected layer of slice physical model printed in the step S12.

One of the exemplary embodiments, the control module 20 may calculate the printing area value of the currently selected slice physical model according to the selected layer of print data (such as the first layer of print data).

Step S15: the control module 20 retrieves a lifting parameter corresponding to the printing area value of the currently selected layer of slice physical model. Above-mentioned lifting parameter is configured to control a lifting height and/or lifting velocity of the lifting module 27, or control the time for the lifting module 27 stopping lifting. One of the exemplary embodiments, the memory module 29 records a corresponding relationship between the different printing area values and the different lifting parameters.

One of the exemplary embodiments, above-mentioned corresponding relationship is stored in the memory module 29 in the form of a lookup table. The control module 20 is configured to searching in the lookup table according to the printing area value for obtaining the corresponding lifting parameter.

One of the exemplary embodiments, above-mentioned corresponding relationship records the corresponding relationship between a plurality of area intervals and the lifting parameters. The control module 20 determines that the printing area value is within any area interval, and searches the corresponding lifting parameter according to this area interval.

Step S16: the control module 20 controls the lifting module 27 to lift the curing platform 24 up according to the retrieved lifting parameter for peeling the current layer of slice physical model (such as peeling the first layer of slice physical model 42) from the bottom of the material tank 23, and spends the continuous time corresponding to this lifting parameter.

Above-mentioned continuous time is not less than a backfilling time for light-curable materials 41.

One of the exemplary embodiments, above-mentioned continuous time may be configured to a time length of the duration of lifting the curing platform 24 up and keeping the status of a distance between the modeling plane and the demodeling film 40 being not less than above-mentioned default thickness t2.

One of the exemplary embodiments, a plurality of the continuous time is different from each other, the control module 20 respectively spends the different continuous time for controlling the lifting module 27 to lift the curing platform 24 up according to the different lifting parameters. Moreover, each continuous time is not less than the backfilling time for backfilling the corresponding printing area value of the light-curable materials 41. More specifically, the control module 20 may control length of the spent continuous time by controlling the lifting height, lifting velocity or time for stopping lifting according to the different lifting parameters.

Above-mentioned backfilling time is the time length of duration of the light-curable materials 41 flowing and completely filling the space (backfilling space) occupied by the current layer of slice physical model before motion. Moreover, the backfilling time is proportional to the printing area value of the current layer of slice physical model.

Please be noted that the required backfilling time is longer if the printing area value is larger. The present disclosed example can make the modeling plane be not lower than the backfilling space and keep this status for a longer continuous time via selecting one of the different lifting parameters to control the lifting module 27. The required backfilling time is shorter if the printing area value is smaller. The present disclosed example can make the modeling plane be not lower than the backfilling space and keep this status for a shorter continuous time via selecting one of the different lifting parameters to control the lifting module 27.

One of the exemplary embodiments, as shown in FIG. 4B, each of above-mentioned lifting parameters may comprise a lifting height, each lifting height is proportional to the printing area value of the corresponding layer of slice physical model. The control module 20 is configured to control the lifting module 27 to lift the curing platform 24 up to the corresponding lifting height. Moreover, the time (namely the continuous time) is longer than the backfilling time, the continuous time is required by the modeling plane of curing platform 24 at a height position t2 lifting up to height h2 and then lifting down for height h2-t2. Namely, the modeling plane t2 firstly rises and then lowers, so as to make the top surface of the current layer of slice physical model (namely the modeling plane of next layer) be a default thickness t2 away from the demodeling film 40. Above status makes the light-curable materials 41 have enough time to flow to backfill a space released by moving the first layer of slice physical model 42 (the space occupied by the first layer of slice physical model 42 shown in FIG. 4A).

Then, the control module 20 may perform the step S10 to the step S13 again for printing the next layer of the slice physical model.

For example, the control module 20 may select the second layer of print data (step S10), make the modeling plane (namely the top surface of the first layer of slice physical model 42) be a default height t2 away from the bottom of the material tank 23 (step S11, as shown in FIG. 4C), and control the light module 21 to irradiate the top surface of the first layer of slice physical model 42 according to the second layer of print data for printing the second layer of slice physical model 43 on the first layer of slice physical model 42 (step S12, as shown in FIG. 4C). Then, when the control module 20 determines that the printing is incomplete (step S13, no), the control module 20 retrieves a printing area value of the second layer of slice physical model 43 (step S14), retrieves the lifting parameter corresponding to the printing area value (step S15, take the lifting parameter comprising a lifting height h3 for example), and lifts the curing platform 24 up to the corresponding lifting height h3 for directly peeling the second layer of slice physical model 43 from the bottom of the material tank 23 (step S16, as shown in FIG. 4D). Moreover, a time (namely the continuous time) is longer than the backfilling time, the continuous time is required by the modeling plane at a height position t2 lifting up to height h3 and then lifting down for height h3-t2. Above status makes the light-curable materials 41 have enough time to flow to backfill the space occupied by the second layer of slice physical model 43 shown in FIG. 4C.

The present disclosed example can complete the printing of all of the slice physical models and stack all of the slice physical models as the 3D physical model via repeating above-mentioned steps.

Please be noted that because the printing area value of the second layer of slice physical model 43 is smaller than the printing area value of the first layer of slice physical model 42 (namely, the backfilling time corresponding to the second layer of slice physical model 43 is shorter than the backfilling time corresponding to the first layer of slice physical model 42), in the present disclosed example, the lifting height h3 which the curing platform 24 is lifted up after completion of printing the second layer of slice physical model 43 is configured to be shorter than the lifting height h2 which the curing platform 24 is lifted up after completion of printing the first layer of slice physical model 42, so as to make the continuous time corresponding to the second layer of slice physical model 43 be shorter than the he continuous time corresponding to the first layer of slice physical model 42.

On the other hand, the present disclosed example can effectively reduce the unnecessary waiting time (such as when the light-curable materials 41 backfill completely, the curing platform 24 is still lifting up or down) via adjusting the lifting parameter dynamically according to the printing area value of the current layer, reduce the time required by the 3D printing, and improve the effectiveness of 3D printing.

Figure 5A:
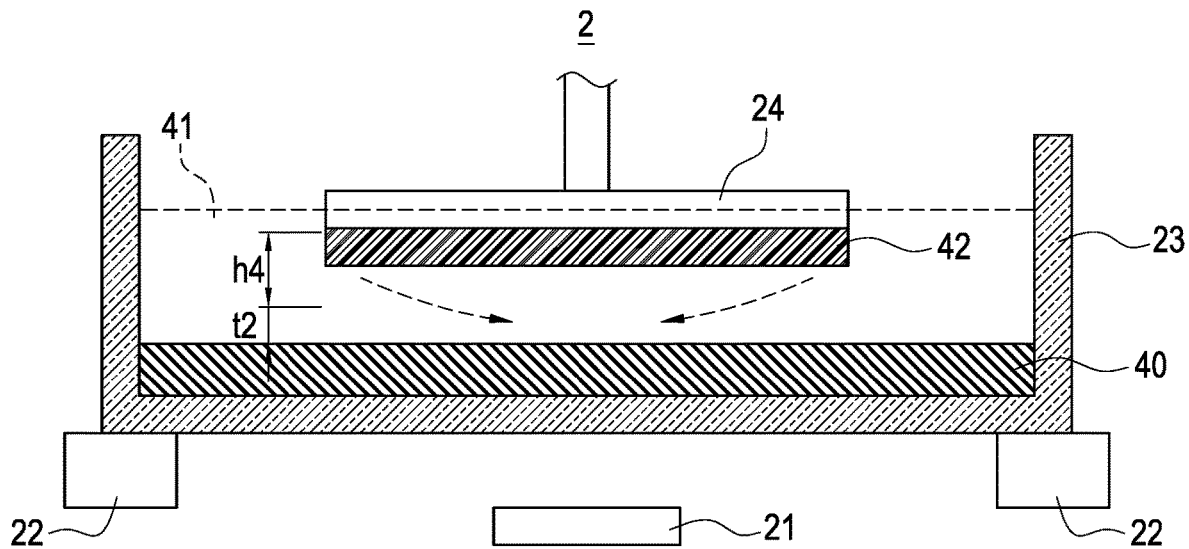
FIG. 5A is a first schematic view of dynamic waiting time mode according to one of embodiments of the present disclosed example.
Figure 5B:
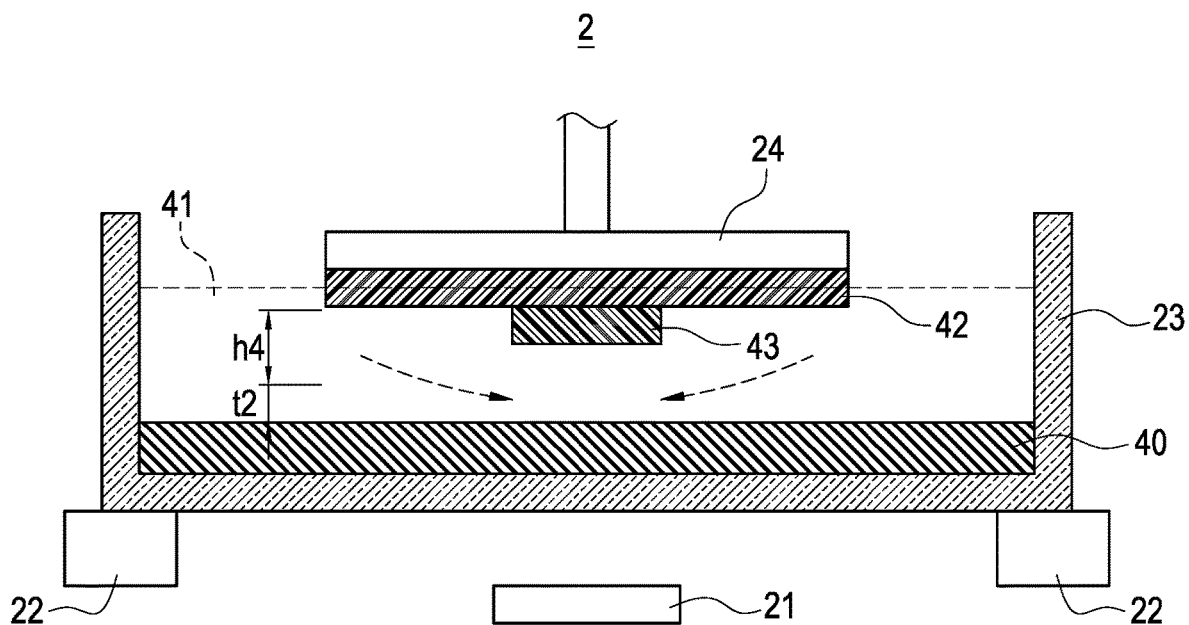
FIG. 5B is a second schematic view of dynamic waiting time mode according to one of embodiments of the present disclosed example.
Figure 6A:
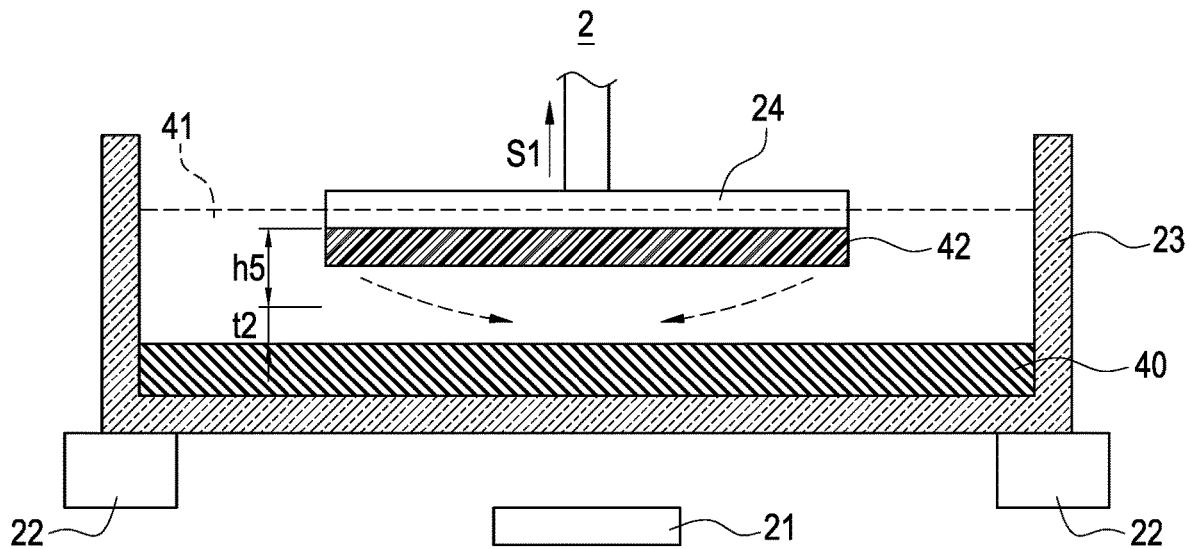
FIG. 6A is a first schematic view of dynamic velocity mode according to one of embodiments of the present disclosed example.
Figure 6B:
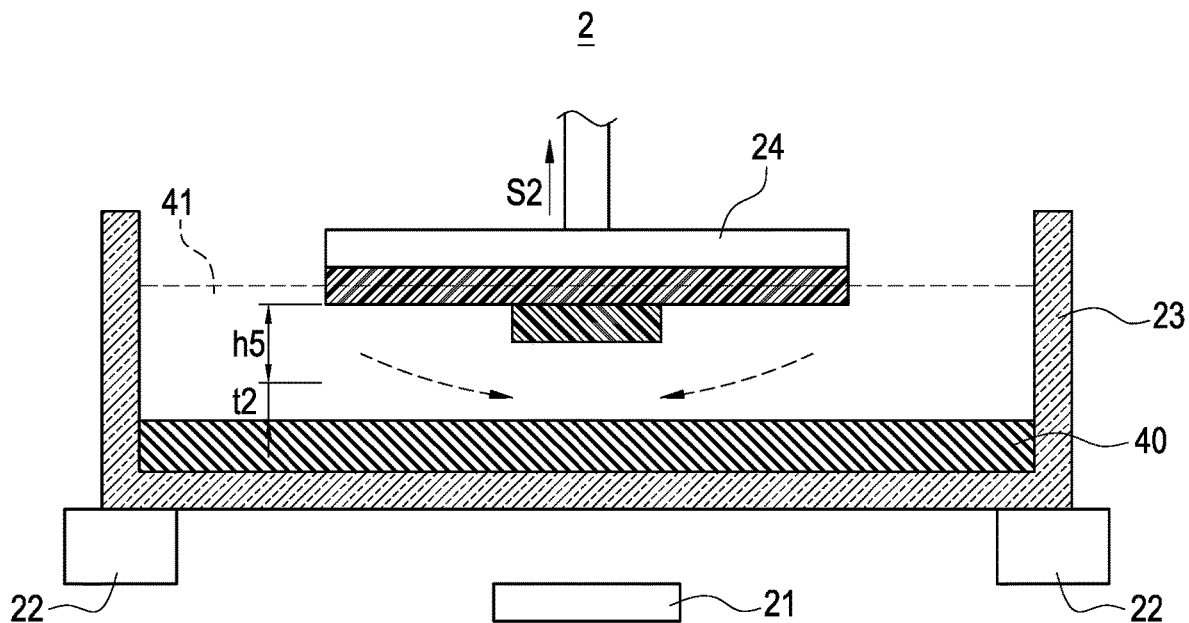
FIG. 6B is a second schematic view of dynamic velocity mode according to one of embodiments of the present disclosed example.
Figure 8:
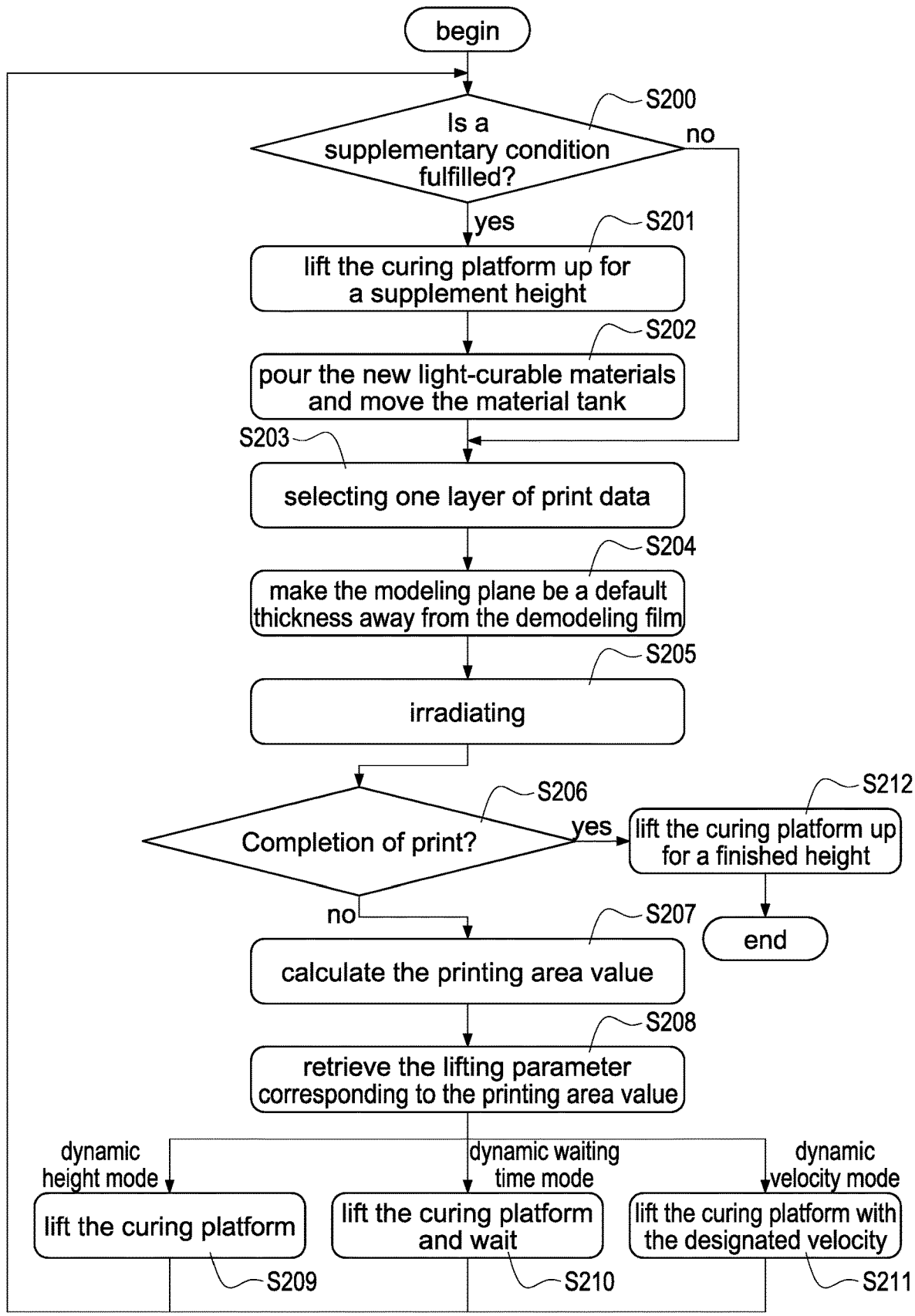
FIG. 8 is a flowchart of a method of dynamically adjusting the lifting parameter according to a second embodiment of the present disclosed example.

Please refer to FIG. 4A to FIG. 4D, FIG. 5A to FIG. 5B, FIG. 6A to FIG. 6B and FIG. 8 simultaneously, FIG. 5A is a first schematic view of dynamic waiting time mode according to one of embodiments of the present disclosed example, FIG. 5B is a second schematic view of dynamic waiting time mode according to one of embodiments of the present disclosed example, FIG. 6A is a first schematic view of dynamic velocity mode according to one of embodiments of the present disclosed example, FIG. 6B is a second schematic view of dynamic velocity mode according to one of embodiments of the present disclosed example, and FIG. 8 is a flowchart of a method of dynamically adjusting the lifting parameter according to a second embodiment of the present disclosed example.

Compare to the embodiment shown in FIG. 7, the method of dynamically adjusting the lifting parameter of this embodiment discloses three lifting modes which are dynamic height mode, dynamic waiting time mode and dynamic velocity mode. A person having ordinary skill in the art may select one or more lifting modes according to demand for dynamically adjusting above-mentioned continuous time based on the printing area value. The method of dynamically adjusting the lifting parameter of this embodiment comprises the following steps.

Step S200: the control module 20 of the stereolithography 3D printer 2 determines whether a default supplementary condition is fulfilled. More specifically, above-mentioned supplementary condition is configured by a user or a developer in advance and stored in the memory module 29. One of the exemplary embodiments, the supplementary condition may be any combination of following conditions: the time before starting to print the first layer of slice physical model 42; each time completion of printing the designated layers (such as 10 layers) of slice physical models; each time completion of printing the designated volume of slice physical models being printed; the liquid level of the light-curable materials 41 in the material tank 23 being lower than a default height and so on.

If the supplementary condition is satisfied, the control module 20 performs the step S201. Otherwise, the control module 20 performs the step S203.

Step S201: the control module 20 controls the lifting module 27 to lift the curing platform 24 up to a default supplement height. Moreover, after completion of lifting up, the modeling plane of the curing platform 24 leaves from the light-curable materials 41 in the material tank 23. Namely, the modeling plane is located above the liquid level of light-curable materials 41. Thus, the new poured light-curable materials 41 don't make a damage on the printed slice physical model(s) during the stereolithography 3D printer 2 pouring the new light-curable materials 41.

Step S202: the control module 20 controls the material-providing module 26 to pour the new light-curable materials 41 into the material tank 23.

One of the exemplary embodiments, the material-providing module 26 pours the stored light-curable materials 41 into the material tank 23 by a transportation pipe (as shown in FIG. 3).

One of the exemplary embodiments, during the material-providing module 26 pouring the light-curable materials 41, the control module 20 may control the moving module 22 to move (such as rotating or horizontally moving back and forth) the material tank 23 according to a default speed (such as 720 degrees per minute) for mixing the existed light-curable materials 41 in the material tank 23 and the new poured light-curable materials 41 evenly and making the mixed light-curable materials 41 fill the material tank 23 evenly.

Step S203: the control module 20 selects one layer the print data sequentially, such as the first layer of print data.

Step S204: the control module 20 moves the curing platform 24 by the lifting module 27 to make the modeling plane be the default thickness t2 away from the bottom of the material tank 23 (as shown in FIG. 4A).

Step S205: the control module 20 controls the light module 21 to irradiate the modeling plane according to the selected layer of print data for printing one layer of slice physical model on the modeling plane (as shown in FIG. 4A).

Step S206: the control module 20 determines whether completion of 3D printing. For example, the control module 20 determines whether all layers of the slice physical models have been printed.

If the control module 20 determines that there is any layer of slice physical model which do not be printed (namely, the 3D printing is incomplete), the control module 20 performs the step S207. Otherwise, the control module 20 performs the step S212.

Step S207: the control module 20 computes the printing area value of the currently selected layer of slice physical model according to the selected layer of print data.

One of the exemplary embodiments, each layer of print data is a 2D image, the control module 20 may count a pixel number of the pixels in a printing region (the printing region may correspond to the region needing to irradiate by light) of the currently selected layer of print data and make the pixel number as the printing area value.

Step S208: the control module 20 retrieves a lifting parameter corresponding to the printing area value of the currently selected layer of slice physical model.

One of the exemplary embodiments, the control module 20 is configured to search in a lookup table according to the printing area value for obtaining the lifting parameter. Above-mentioned the lookup table records a corresponding relationship between a plurality of the printing area values (or a plurality of area intervals) and a plurality of the lifting parameters.

Then, the control module 20 may selectively run one or more corresponding lifting mode(s) according to the retrieved lifting parameter.

One of the exemplary embodiments, if the lifting parameter comprises a lifting height (the lifting height is greater than the default thickness t2), the control module 20 performs step S200: the control module 20 under the dynamic height mode controlling the lifting module 27 to lift the curing platform 24 up to the lifting height of the corresponding lifting parameter to peel the current layer of slice physical model from the material tank 23. Moreover, the light-curable materials 41 in the material tank 23 will complete to backfill during lifting.

One of the exemplary embodiments, the supplement height described in the step S201 is greater than the lifting height of each lifting parameter. Moreover, the lifting height is configured to be proportional to the printing area value.

For example, as shown in FIG. 4B, after completion of printing the first layer of slice physical model 42 (the peeling height is greater and the backfilling time required by backfilling completely is longer because of the larger printing area value), the control module 20 controls the lifting module 27 to lift the curing platform 24 up to the greater lifting height h2, and lift down to the height h2-t2. Namely, the continuous time spent on this lifting is longer. As shown in FIG. 4D, after completion of printing the second layer of slice physical model 43 (the required peeling height is less and the backfilling time required by backfilling completely is shorter because of the smaller printing area value), the control module 20 controls the lifting module 27 to lift the curing platform 24 up to the less lifting height h3, and lift down to the height h3-t2. Namely, the continuous time spent on this lifting is shorter.

One of the exemplary embodiments, if the lifting parameter comprises a waiting time, the control module 20 may perform step S210: the control module 20 under the dynamic waiting time mode controlling the lifting module 27 lift the curing platform 24 to the default height (the default height is not less than the default thickness t2) for peeling the current layer of the slice physical model form the material tank 23. Then, the control module times a waiting time for the lifting parameter and controls the lifting module 27 to stop waiting for the light-curable materials 41 backfilling completely after completion of lifting up.

One of the exemplary embodiments, the waiting time is configured to be proportional to the printing area value.

For example, as shown in FIG. 5A, after completion of printing the first layer of slice physical model 42 (the backfilling time required by backfilling completely is longer because of the larger printing area value), the control module 20 controls the lifting module 27 to lift the curing platform 24 up to the default lifting height h4 which is greater than the peeling height, waiting for the longer waiting time (such as five seconds), and lift down to the height h4-t2. Namely, the continuous time spent on this lifting is longer. For example, as shown in FIG. 5B, after completion of printing the second layer of slice physical model 43 (the backfilling time required by backfilling completely is shorter because of the smaller printing area value), the control module 20 controls the lifting module 27 to lift the curing platform 24 up to the default lifting height h4, waiting for the shorter waiting time (such as three seconds), and lift down to the height h4-t2 (if the lifting height h4 is greater than the default thickness t2). Namely, the continuous time spent on this lifting is shorter.

One of the exemplary embodiments, if the lifting parameter comprises a lifting velocity, the control module 20 may perform the step S211: the control module 20 under the dynamic velocity mode controlling the lifting module 27 to lift the curing platform 24 up according to the lifting velocity of the lifting parameter to the default height (the default height is not less than the default thickness t2).

One of the exemplary embodiments, the lifting velocity is configured to be inversely proportional to the corresponding printing area value.

For example, as shown in FIG. 6A, after completion of printing the first layer of slice physical model 42 (the backfilling time required by backfilling completely is longer because of the larger printing area value), the control module 20 controls the lifting module 27 to lift the curing platform 24 up according to a slower lifting velocity S1 to the default lifting height h5 which is greater than the peeling height, and lift down to the height h5-t2 (if the lifting height h5 is greater than the default height t2). Namely, the continuous time spent on this lifting is longer. For example, as shown in FIG. 6B, after completion of printing the second layer of slice physical model 43 (the backfilling time required by backfilling completely is shorter because of the smaller printing area value), the control module 20 controls the lifting module 27 to lift the curing platform 24 up according to a faster lifting velocity S2 to the default lifting height h5, and lift down to the height h5-t2 (if the lifting height h5 is greater than the default height t2). Namely, the continuous time spent on this lifting is shorter.

Then, the control module 20 may perform the step S10 to the step S13 again for printing the next layer of slice physical model.

Please be noted that although the control module 20 only executes one of the three lifting modes (namely, only one of the steps S209-S211 is performed simultaneously) in above-mentioned embodiment, but this specific example is not intended to limit the scope of the present disclosed example.

One of the exemplary embodiments, the control module 20 may run two or more of the three lifting modes. Namely, two or more of the steps S209-211 are performed simultaneously.

For example, if the lifting parameter comprises a lifting height and a waiting time, each lifting height and/or each waiting time is proportional to the corresponding printing area value of each layer of slice physical model. The control module 20 controls the lifting module 27 to lift the curing platform 24 up to the corresponding lifting height and wait for the corresponding waiting time after completion of printing each layer of slice physical model.

In another example, if the lifting parameter comprises a lifting height, a waiting time and a lifting velocity. The control module 20 controls the lifting module 27 to lift the curing platform 24 up according to the corresponding lifting velocity to the corresponding lifting height and wait for the corresponding waiting time after completion of printing each layer of slice physical model.

Thus, the present disclosed example can make the time for moving the curing platform 24 be close to the backfilling time for the light-curable materials 41 via adjusting the moving status of the curing platform 24, so as to reduce the time for meaningless waiting, and further reduce the time required by 3D printing.

If the control module 20 determines that completion of 3D printing in step S206, the control module 20 performs step S212: the control module 20 controlling the lifting module 27 to lift the curing platform 24 up to a finished height, and all of the printed slice physical models leaving from the light-curable materials 41 in the material tank 23.

One of the exemplary embodiments, above-mentioned finished height is greater than all of above-mentioned lifting heights.

Please be noted that each of above-mentioned peeling heights corresponding to the different printing area values is a minimum height required by peeling the corresponding printing area value of slice physical model successfully. Moreover, the peeling height is greater than the default thickness.

Please be noted that although this embodiment determines the lifting parameter according to the printing area value, but this specific example is not intended to limit the scope of the present disclosed example. In another embodiment, the present disclosed example may determine the lifting parameter (such as lifting height, lifting velocity and/or waiting time) according to a printing volume value (the printing volume value may be a result of the printing area value being multiplied by default thickness).

Take a liquid level of the light-curable materials 41 in the material tank 23 being not less than 3 millimeters for example. The stereolithography 3D printer 2 may control the curing platform 24 to lift up to the first lifting height (such as 2 millimeters) when the printing volume value is less than 150π cubic millimeter. The stereolithography 3D printer 2 may control the curing platform 24 to lift up to the second lifting height (such as 5 millimeters) when the printing volume value is not less than 150π cubic millimeter and less than 3007 cubic millimeter. The stereolithography 3D printer 2 may control the curing platform 24 to lift up to the third lifting height (such as 7 millimeters) when the printing volume value is not less than 300π cubic millimeter and less than 600π cubic millimeter. The stereolithography 3D printer 2 may control the curing platform 24 to lift up to the fourth lifting height (such as 10 millimeters) when the printing volume value is not less than 600π cubic millimeter and less than 900π cubic millimeter. Thus, the present disclosed example can save the unnecessary waiting time or the printing speed.

The above-mentioned are only preferred specific examples in the present disclosed example, and are not thence restrictive to the scope of claims of the present disclosed example. Therefore, those who apply equivalent changes incorporating contents from the present disclosed example are included in the scope of this application, as stated herein.

What is claimed is:

1. A method of dynamically a adjusting lifting parameter, the method of dynamically the adjusting lifting parameter being applied to a stereolithography 3D printer, the stereolithography 3D printer comprising a light module, a curing platform, a material tank used to accommodate light-curable materials, and a lifting module, a light-transmissive demodeling film being laid on bottom of the material tank, the method of dynamically adjusting lifting the parameter comprising following steps:
   a) selecting one layer of print data which comprises multiple layers;
   b) controlling the lifting module to lift, such that a modeling plane of the curing platform is positioned a default thickness above the demodeling film;
   c) controlling the light module to irradiate the light-curable materials between the modeling plane and the demodeling film according to the selected layer of print data for printing one layer of a sliced physical model on the modeling plane;
   d) retrieve a printing area value of the printed layer of the sliced physical model;
   e) retrieving one of lifting parameters based on the printing area value being retrieved, wherein each lifting parameter comprises a lifting height, each lifting height is proportional to the corresponding printing area value;
   f) controlling the lifting module to lift the curing platform up to the respective lifting height according to the lifting parameter for peeling the printed layer of the sliced physical model, wherein the lifting parameters respectively correspond to the different printing area values, and each lifting parameter defines a time period for controlling the lifting of the curing platform that is not less than a backfilling time for the light-curable materials;
   g) performing the step a) to the step f) repeatedly until all of the layers of the sliced physical models have been printed and are stacked as a 3D physical model, wherein each layer of the print data is selected sequentially during repeatedly performing the step a); and
   h) controlling the lifting module to lift the curing platform up to a finished height when all of the layers of sliced physical models have been printed, wherein the finished height is greater than all of the lifting heights.

2. The method dynamically adjusting lifting the parameter according to claim 1, wherein according to the different lifting parameters each time period for controlling the lifting of the curing platform is a different time period, each time period is not less than the backfilling time for the light-curable materials backfilling the corresponding printing area value.

3. The method dynamically adjusting lifting the parameter according to claim 1, wherein the time period is a time period wherein the curing platform is controlled such that a position of the modeling plane is not less than the default thickness above the demodeling film.

4. The method dynamically adjusting lifting the parameter according to claim 1, wherein the step d) further comprises a step d1) counting a pixel number of a plurality of pixels in a printing region of the layer selected in the step a) of the print data and configuring the pixel number as the printing area value.

5. The method dynamically adjusting lifting the parameter according to claim 1, further comprising following steps:
   i1) controlling the lifting module to lift the curing platform up to a supplement height, such that the modeling plane is lifted above the surface of the light-curable materials in the material tank when a supplementary condition is fulfilled;
   i2) controlling a material-providing module of the stereolithography 3D printer to pour the new light-curable materials into the material tank; and
   i3) controlling the moving module to move the material tank for making the light-curable materials in the material tank flow during pouring the new light-curable materials.

6. The method dynamically adjusting lifting the parameter according to claim 1, wherein each lifting parameter further comprises a waiting time, each lifting height or each waiting time is proportional to the corresponding printing area value, the step f) further comprises controlling the lifting module to lift the curing platform upto the lifting height and wait to the waiting time.

7. The method dynamically adjusting lifting the parameter according to claim 6, wherein each lifting parameter of the lifting height is the same lifting height and each waiting time of each lifting parameter is a different time period.

8. The method of dynamically adjusting lifting the parameter according to claim 1, wherein each lifting parameter further comprises a lifting velocity, each lifting velocity is inversely proportional to the corresponding printing area value, the step f) further comprises controlling the lifting module to lift the curing platform according to the lifting velocity to the lifting height.

9. The method dynamically adjusting lifting the parameter according to claim 1, wherein the step e) further comprises searching a lookup table according to the printing area value for obtaining the lifting parameter, wherein the lookup table records a corresponding relationship between the printing area values and the lifting parameters.

10. The method dynamically adjusting lifting the parameter according to claim 1, wherein the demodeling film comprises light-transmissive silicone or polytetrafluoroethylene, the modeling plane is a worktop of the curing platform or the printed top layer of the sliced physical model.

11. The method dynamically adjusting lifting the parameter according to claim 1, wherein each layer of the print data is a 2D image; wherein the step c) further comprises controlling the light module to irradiate a plurality of positions of the modeling plane corresponding to a plurality of pixels of the layer of the print data according to a plurality of pixel values of the pixels for printing one layer of the sliced physical model.

* * * * *